United States Patent
Yamazaki et al.

(10) Patent No.: US 6,818,856 B2
(45) Date of Patent: Nov. 16, 2004

(54) LASER MACHINING APPARATUS

(75) Inventors: Etsuo Yamazaki, Yamanashi (JP);
Atsushi Mori, Yamanashi (JP);
Motohiko Sato, Yamanashi (JP)

(73) Assignee: Fanuc LTD, Yamanashi (JP)

( * ) Notice: Subject to any disclaimer, the term of this patent is extended or adjusted under 35 U.S.C. 154(b) by 40 days.

(21) Appl. No.: 10/426,651

(22) Filed: May 1, 2003

(65) Prior Publication Data

US 2003/0234240 A1 Dec. 25, 2003

(30) Foreign Application Priority Data

Jun. 21, 2002 (JP) ........................................ 2002-182119

(51) Int. Cl.[7] ....................... B23K 26/00; B23K 26/04;
B23K 26/42; G05B 17/02; H01S 5/068
(52) U.S. Cl. .................................. 219/121.62; 700/166
(58) Field of Search ........................ 219/121.6, 121.61,
219/212.62, 121.67, 121.68, 121.69, 121.7,
121.71, 121.72, 121.83; 700/166

(56) References Cited

U.S. PATENT DOCUMENTS

| | | | | |
|---|---|---|---|---|
| 5,004,889 A | * | 4/1991 | Yamazaki et al. | ..... 219/121.61 |
| 5,719,796 A | * | 2/1998 | Chen | ........................... 703/13 |
| 5,841,096 A | | 11/1998 | Takahashi et al. | |

FOREIGN PATENT DOCUMENTS

| | | |
|---|---|---|
| DE | 19621645 C1 | 10/1997 |
| JP | 8-168891 | 7/1996 |
| JP | 10-84156 | 3/1998 |
| JP | 11-296204 | 1/1999 |
| JP | 2001-287059 | 10/2001 |
| JP | 2001-300750 | 10/2001 |

OTHER PUBLICATIONS

European Search Report for application No. EP 03253700 dated Oct. 2, 2003.

* cited by examiner

*Primary Examiner*—Samuel M. Heinrich
(74) *Attorney, Agent, or Firm*—Staas & Halsey LLP (57) ABSTRACT

A laser machining apparatus capable of effecting a feedback control of a laser output from an early stage of operation and detecting an abnormality of the laser output quickly and precisely. A laser output command issued from a laser output commanding section is subjected to a feedback control and inputted to a laser pumping power supply for a laser oscillator. An output of a laser power sensor is amplified by an amplifier and compared with an output of a measurement simulating section for estimating the measured value of the laser output. A difference of the measured value and the simulated value of the laser output is inputted to the feedback control section and also to an output abnormality detecting section. A measurement input estimating section calculates an average power which should be outputted in a normal condition of the laser machining based on data of the laser output command. A fist order delay system can be adopted as the measurement simulating section. The laser output abnormality detecting section determines whether or not the difference of the measured value and the simulated value is within an allowable range for the detection of an abnormality of the laser machining.

25 Claims, 9 Drawing Sheets

| FREQUENCY<br>DUTY | 5Hz | 50Hz | 250Hz | 500Hz | 1000Hz | 2000Hz | 5000Hz |
|---|---|---|---|---|---|---|---|
| 0 % | 0 | 0 | 0 | 0 | 0 | 0 | 0 |
| 2 0 % | 1000 | 1050 | 1100 | 1150 | 1200 | 1100 | 1100 |
| 4 0 % | 2000 | 2100 | 2250 | 2450 | 2600 | 2400 | 2300 |
| 6 0 % | 3000 | 3150 | 3350 | 3450 | 3800 | 3700 | 3300 |
| 8 0 % | 4000 | 4200 | 4450 | 4500 | 4600 | 4500 | 4200 |
| 1 0 0 % | 5000 | 5000 | 5000 | 5000 | 5000 | 5000 | 5000 |

FIG.9b

| FREQUENCY<br>DUTY | 5Hz | 50Hz | 250Hz | 500Hz | 1000Hz | 2000Hz | 5000Hz |
|---|---|---|---|---|---|---|---|
| 0 % | 0 | 0 | 0 | 0 | 0 | 0 | 0 |
| 2 0 % | 100 | 80 | 65 | 50 | 80 | 100 | 100 |
| 4 0 % | 200 | 160 | 130 | 100 | 160 | 200 | 200 |
| 6 0 % | 300 | 280 | 230 | 250 | 280 | 300 | 300 |
| 8 0 % | 400 | 300 | 350 | 380 | 400 | 400 | 400 |
| 1 0 0 % | 500 | 500 | 500 | 500 | 500 | 500 | 500 |

# LASER MACHINING APPARATUS

BACKGROUND OF THE INVENTION

1. Field of the Invention

The present invention relates to a laser machining apparatus for machining a workpiece by a laser beam, and in particular to a laser machining apparatus equipped with a high power laser for performing laser machining by frequently changing and precisely controlling a laser output.

2. Description of Related Art

It has been carried out to utilize a successively measured value of a laser output of a laser oscillator provided in a laser machining apparatus for stabilizing laser machining by the laser machining apparatus. In general, a part of the laser beam transmitted through a rear mirror arranged opposite to an output mirror of the laser oscillator is inputted into a power sensor for measurement of the laser output. In a case of a laser oscillator having a reflecting mirror for reflecting the laser beam emitted from a laser resonator, there can be adopted an arrangement for taking out the part of the laser beam by transmission through the reflecting mirror for the measurement.

Thus, the laser output power is measured on the real-time basis in the laser machining. The laser output measured on the real-time basis is utilized in the following applications.

(1) Utilization of the measured value as data representing a present value of the laser output in a feedback control of the laser output for stabilizing the laser output.

(2) Detection of an abnormal status of laser machining by an prominent increase of a laser beam reflected on a workpiece made of material having high reflectance with respect to the laser beam and returned to the laser oscillator.

(3) Diagnose of malfunction of the laser oscillator by abnormal decrease of the laser output.

There is an nonnegligible delay of response in the power sensor for measuring the laser output. Particularly for measurement of high-power laser, it is generally adopted a type of a power sensor in which the laser beam is converted into heat and heat flow rate is measured. The time required for response to a change of the laser output is considerably late in comparison with the time from issuance of a laser output command to an actual output of the laser beam.

In an ordinary laser machining apparatus, time required for an actual output of the laser beam to reach 95% of the laser output command from an issuance of the laser output command is approximately 0.0002 sec, whereas the time required for the measured value to reach 95% of the laser output command is approximately 3 sec. Thus, it takes a long time for the measured value of the power sensor to reflect the actual output, whereas a time period from issuance of the output command to the actual output of the laser beam is instantaneous, no to be satisfactory for the foregoing applications (1)–(3).

Figure 1:
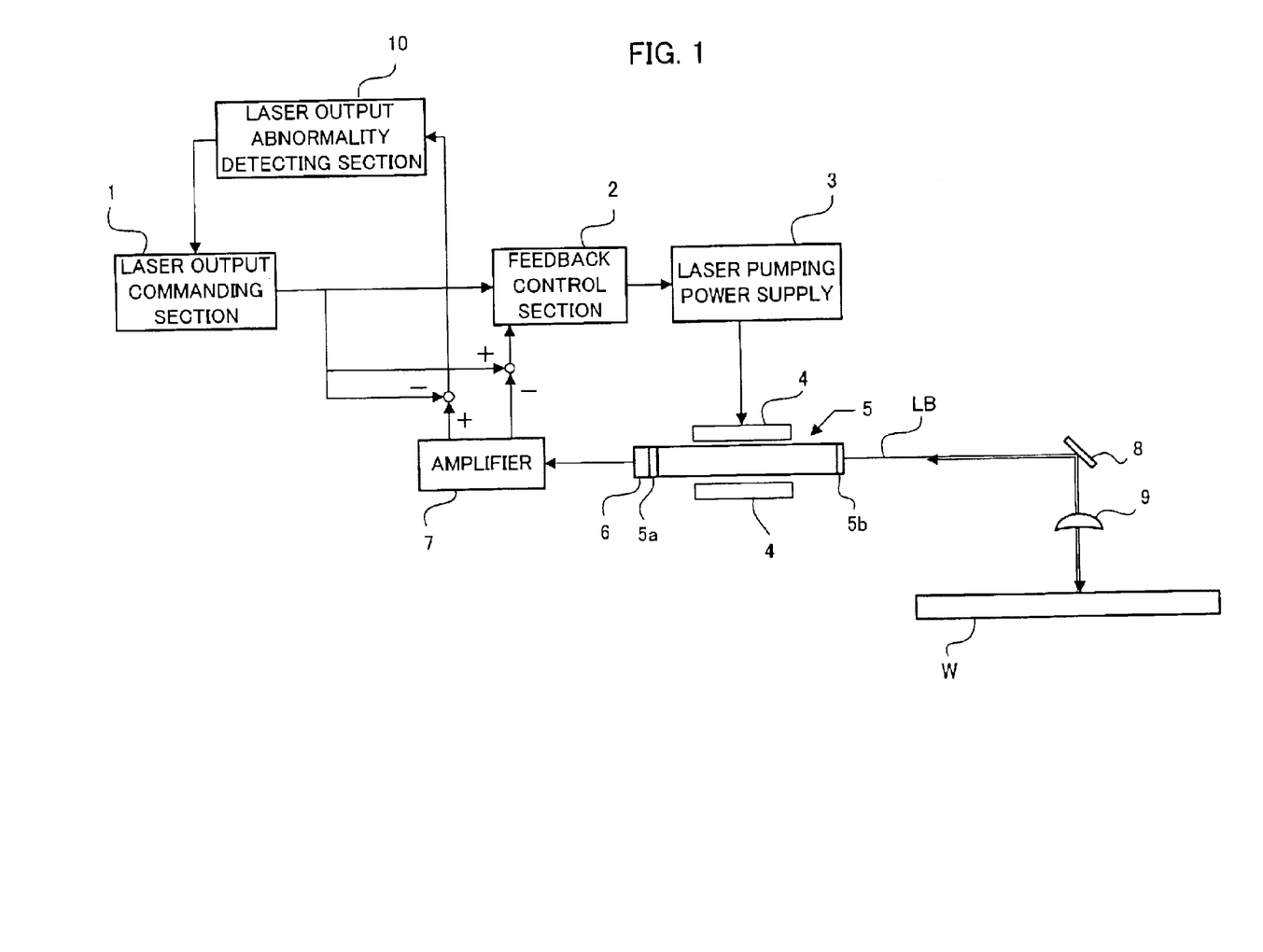
FIG. 1 is a block diagram schematically showing a system configuration of a conventional laser machining apparatus.

In order to explain the above circumstance using an example, FIG. 1 shows an example of a system configuration of a conventional laser machining apparatus in which the above applications (1)–(3) can be performed. As shown in FIG. 1, a laser oscillator 5 for outputting a laser beam LB to be irradiated on a workpiece W through a mirror 7 and a condenser lens 8 may comprise a YAG laser which is pumped by a pumping source 4 such as a pumping lamp and a pumping LED to which electric power is supplied from a laser pumping power supply 3.

A laser output command for controlling the laser output is issued from a laser output commanding section 1 to the laser pumping power supply 3 through a feedback control section 2 to supply an electric power to the laser pumping power supply 3. The laser output command is designated by a machining program or a manual operation on a control panel (not shown).

A laser power sensor 6 provided outside of a rear mirror 5a of the laser oscillator 5 regularly monitors the laser output (laser power). An output signal of the laser power sensor 6 is amplified by an amplifier 7 and compared with the laser output command, and a difference therebetween is inputted into the feedback control section 3. The laser power sensor 6 and the amplifier 7 constitutes laser output measuring means.

As a result of the comparison, if the measured value of the laser output is lower than the laser output command value, a signal indicating a positive difference is outputted to the feedback control section 2, and if the measured value is greater than the laser output command value, a signal indicating a negative difference is outputted to the feedback control section 2. The feedback control section 2 compensates the laser output command in accordance with the signal indicating the difference by a feedback control. The feedback control of the laser output to control the laser output to coincide with the command value is performed.

Further to the above feedback control, the output of the amplifier 7 indicating the measured value of the laser power is compared with the laser output command and a difference therebetween is inputted into an output abnormality detecting section 10. As a result of the comparison, if the measured value of the laser power is lower than the laser output command value, a signal indicating a positive difference is outputted to the laser power abnormality detecting section 10, and if the measured value is greater than the command value, a signal indicating a negative difference is outputted to the laser power abnormality detector 10.

The output power abnormality detector 10 determines whether or not the difference is within an allowable range and if the difference deviates from the allowable range, it is determined that an abnormality has occurred and a stop signal is issued to the laser output command means to stop the operation of the laser oscillator 5.

It is determined that an abnormality occurs in a case where a laser beam reflected on a workpiece and returned to the laser oscillator greatly increases by an abnormality of the laser machining on the workpiece which is made of a material having high reflectance of the laser beam (in the application of (2)), and in a case where the laser output abnormally decreases by a malfunction of the laser oscillator (in the application (3)).

Figure 2A:
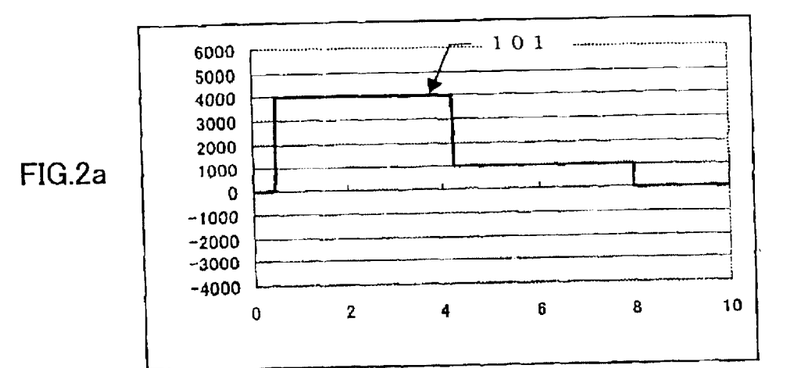
FIG. 2a is a graph showing an example of a transition pattern of a laser output command.

The delay of response of the laser power sensor 6 will be described on a case where a laser output command as shown in FIG. 2a is issued from the laser output commanding section 1. In FIG. 2a, a pattern of a laser output command 101 is shown with an axis of abscissa representing time (sec.) and an axis of ordinate representing an output power (W). In this example, the laser output command 107 is designated by a machining program. The command value is 4 kW in an early section for 3.5 sec., and is 1 kW in a later section for 4 sec.

Figure 2B:
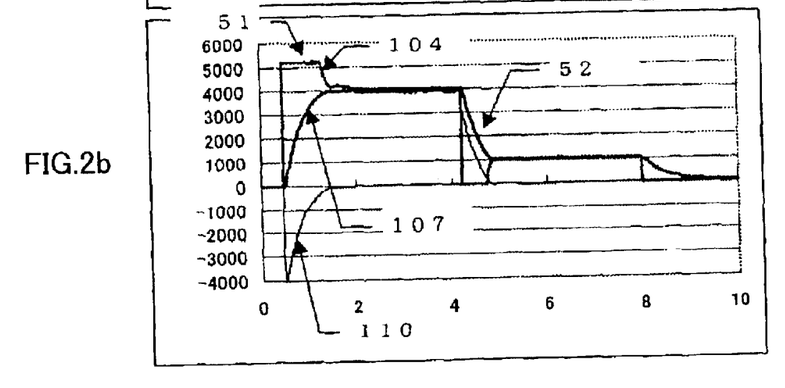

FIG. 2b shows a transition of the measured value 107 of the laser output power, a laser output command value 104 after subjected to the feedback control and a difference 110 between the laser output command and the measured value 107 in a case where the laser output command 101 is issued to the laser machining system with the feedback control of the laser output power, as shown in FIG. 1. In FIG. 2b, an axis of abscissa indicates time (sec.) and an axis of ordinate indicates output power (W).

As shown in FIG. 2b, a status where the measured value 107 is lower than the command value 101 continues for a considerable rise period (from 0 kW to 4 kW) immediately after an issuance of the laser output command 101 due to a delay of response of the power sensor 6. Accordingly, a signal indicating a luck of output power is issued to the feedback control section 2, so that the laser output command 104 increases to an upper limit of the laser oscillator 5 under the feedback control, as indicated by a reference numeral 51. Then, the measured value 107 approaches the command value 101 of 4 kW to terminate the above status and enters a state where the command value 101, the laser output command 104 subjected to the feedback control and the measured value 107 coincide with one another. Thus, there exists a time period in which an excessive power is outputted at the rise of the laser output command 101.

Then, immediately after the command value 101 is changed from 4 kW to 1 kW, the measured value 107 excesses the command value 101 for a while. Therefore, the signal indicating excessive output is inputted to the feedback control section to drop the compensated laser output command 104 by the feedback control to zero, as indicated by a reference numeral 52. As a result, the laser machining is stopped instantaneously.

The above status is terminated when the measured value 107 drops to the command value of 1 kW, to enter a state where the command value 101, the command value 104 after the feedback control, and the measured value 107 coincide with one another. There is a possibility of causing a period in which too small laser power, e.g. zero is outputted immediately after termination of the output command.

Further, in the case of abnormal increase of the reflected light from a workpiece to the laser oscillator by an abnormality of the laser machining, and abnormal decrease of the output power by a malfunction of the laser oscillator, it takes a long time for the signal indicating the abnormality to be inputted into the output abnormality detecting section 10, to fail in taking a rapid response such as stopping of the operation.

As described, an effective operation of the control system can not be performed until the measured value by the power sensor 6 reaches the actual laser output. There is a proposal of an arrangement with respect to the detection of abnormality of the laser machining in JP 2001-287059A. In this proposal, it is attempted to detect an abnormality of laser machining by comparing an output of a simulator of the power sensor based on the laser output command value with the measured value of the power sensor to compensate the response time of the power sensor to enable the abnormality detection of the output power immediately after the rise and fall of the laser output command.

However, in this arrangement, precision of the abnormality detection is not sufficiently high due to an influence of the feedback compensation of the laser output, as discussed. Thus, a first object of the present invention is to provide a laser machining apparatus capable of performing a precise detection of an abnormality of the laser machining in a system using the feedback control of the laser output.

Further, in the above arrangement, specifically in a rise of the laser output command, a feedback error increases to cause an overshoot, since the measured value of the power sensor is lower than the laser output command. If a gain of the feedback control is set to a lower value in order to avoid the increase of the feedback error, it would be difficult to make the actual laser output coincide with the laser output command value in a steady state.

In JP 8-168891A, it is proposed to solve the above problem by gradually connecting a feedback path in FIG. 55. However, it is a matter of course that it is preferable to effect the feedback control as soon as possible. Thus, it is a second embodiment of the present invention to provide a laser machining apparatus capable of effecting the feedback control immediately after the rise of the laser output command.

There is a difficulty in using the measured value of the power sensor for the feedback control in a case of a pulse oscillation output whereas the measured value of the laser output is substantially equal to the command value except periods immediately after the sudden change of the command value in a case of a continuous oscillation output. Specifically, if the laser output wave is in the form of an exact rectangle, the measured value can be obtained by multiplication of a pulse peak value and a pulse duty value, but it is usual that the actual waveform is not in the form of an exact rectangle. Further, in the case where a laser output in the form of a trapezoid or a triangle is adopted for advantage of machining performance, an averaged of the laser output measured by the power sensor can not obtained by a simple theoretical equation.

In respect to the above, it is proposed that a gap between the actual output power and the command value of the laser output in the form of a pulse is compensated by a feedforward control using a characteristic table. According to this proposal, the feedback control can be utilized in the pulse oscillation output for stabilizing the laser output.

However, the feedforward control is effective in a case where the pulse waveform has a substantially rectangular form, but in the case of a waveform significantly different from the rectangular form, it is impossible to perform a desired machining since the feedforward value is made excessively large. It is therefore a third object of the present invention to perform the applications in the case of the pulse oscillation output equivalent to those in the case of the continuous oscillation output by effectively using a characteristic table without need of the feedforward control.

Further, in the case of the laser machining such as laser piercing, laser marking and laser welding in which a considerable amount of the outputted laser beam returns to the laser oscillator, the laser output may drop due to the feedback control to fail in continuously perform the laser machining. It is therefore a fourth object of the present invention to precisely perform the feedback control and the output abnormality detection in such case.

SUMMARY OF THE INVENTION

The present invention provides a laser machining apparatus capable of shortening a response time of the feedback control and improving lowering of precision of abnormality detection of laser machining by influence of the feedback control by simulation of the measurement by the laser power sensor for measuring an output power of a laser oscillator, and comparison of the simulated value and the measured value of the laser output.

The following system configurations of a laser machining apparatus for machining a workpiece by a laser beam outputted from a laser oscillator in accordance with a laser output command are provided according to the present invention.

According to a first aspect of the present invention, the laser machining apparatus comprises: laser output commanding means for issuing the laser output command; laser power measuring means for measuring an output power of the laser beam and outputting a measured value of the output power including an error due to a response characteristic thereof; measurement simulating means for estimating the measured value outputted from the laser power measuring means based on the laser output command issued from the laser output commanding means and the response characteristic of the laser power measuring means, and outputting a simulated value of the laser power measurement; and feedback control means for feedback compensating the laser output command in accordance with a difference between the measured value outputted from the laser power measuring means and the simulated value outputted from the measurement simulating means.

In this system configuration, laser output abnormality detecting means may be provided for detecting an abnormality of the laser output based on a difference between the simulated value outputted from the measurement simulating means and the measured value outputted from the laser power measuring means.

The measurement simulating means may comprise measurement input estimating means for estimating a laser power representative value representing an averaged laser power inputted into the laser power measuring means based on the laser output command issued from the laser output commanding means, and estimates the measured value outputted from the laser power measuring means using the laser power representative value estimated by the measurement input estimating means.

The measurement input estimating means may store a data table containing data of the averaged laser power with parameters of a pulse waveform or a pulse peak value, a pulse duty and a pulse frequency, and obtain the laser power representative value using the data in the data table by interpolation or extrapolation.

Alternatively, the measurement input estimating means may store an approximation equation for expressing the averaged laser power by a mathematical function of a pulse waveform or a pulse peak value, a pulse duty and a pulse frequency, and obtains the laser power representative value using the approximation equation.

The measurement input estimating means stores a plurality of data tables or approximation equations for the measurement input estimation and selectively uses one of the data tables or one of the approximation equations in accordance with a machining condition.

According to a second aspect of the present invention, the laser machining apparatus comprises: laser output commanding means for issuing the laser output command; laser power measuring means for measuring an output power of the laser beam and outputting a measured value including an error due to a response characteristic thereof; feedback control means for feedback compensating the laser output command issued from the laser output commanding means in accordance with a difference between the measured value outputted from the laser power measuring means and the laser output command; and measurement simulating means for estimating the measured value outputted from the laser power measuring means based on the compensated laser output command by the feedback control means and the response characteristic of the laser power measuring means, and outputting a simulated value of the laser power measurement; and laser output abnormality detecting means for detecting an abnormality of the laser output based on a difference between the simulated value outputted from the measurement simulating means and the measured value outputted from the laser power measuring means.

In this system configuration, the measurement simulating means may comprises measurement input estimating means for estimating a laser power representative value representing an averaged laser power inputted into the laser power measuring means based on the compensated laser output command by the feedback control means, and estimates the measured value outputted from the laser power measuring means using the laser power representative value estimated by the measurement input estimating means.

According to a third aspect of the present invention, the laser machining apparatus comprises: laser output commanding means for commanding the laser output; laser power measuring means for measuring an output power of the laser beam and outputting a measured value including an error due to a response characteristic thereof; first measurement-simulating means for estimating the measured value outputted from the laser power measuring means based on the laser output command issued from the laser output commanding means and the response characteristic of the laser power measuring means, and outputting a first simulated value of the laser power measurement; feedback control means for feedback compensating the laser output command issued from the laser output commanding means in accordance with a difference between the measured value outputted from the laser power measuring means and the first simulated value outputted from the first-measurement simulating means; second measurement-simulating means for estimating the measured value outputted from the laser power measuring means based on the compensated laser output by the feedback control means and the response characteristic of the laser power measuring means, and outputting a second simulated value of the laser power measurement; and laser output abnormality detecting means for detecting an abnormality of the laser output based on a difference between the second simulated value outputted from the second measurement-simulating means and the measured value outputted from the laser power measuring means.

In this system configuration, the first measurement-simulating means may comprise a first measurement-input estimating means for estimating a laser power representative value representing an averaged laser power inputted into the laser power measuring means based on the laser output command issued from the laser output commanding means, and estimates the measured value outputted from the laser power measuring means using the laser power representative value estimated by the first-measurement input estimating means. The second-measurement simulating means may comprise a second measurement-input estimating means for estimating a laser power representative value representing an averaged laser power inputted into the laser power measuring means based on the compensated laser output command by the feedback control means, and estimates the measured value outputted from the laser power measuring means using the laser power representative value estimated by the second measurement-input estimating means.

In the foregoing system configurations, the laser machining apparatus may further comprises laser output command correcting means for correcting the laser output command issued from the laser output commanding means in accordance with operation data of the laser machining apparatus and/or an external signal.

The measured value outputted from the laser power measuring means may be substituted for an initial value of the simulated value by the measurement simulating means each time when the laser output commanding means changes the laser output command in accordance with a change of the machining condition.

BRIEF DESCRIPTION OF THE DRAWINGS

FIG. 2b is a graph showing transition of a measured value of a laser power in response to the laser output command as shown in FIG. 2a;

DETAILED DESCRIPTION OF THE PREFERRED EMBODIMENTS

Figure 3:
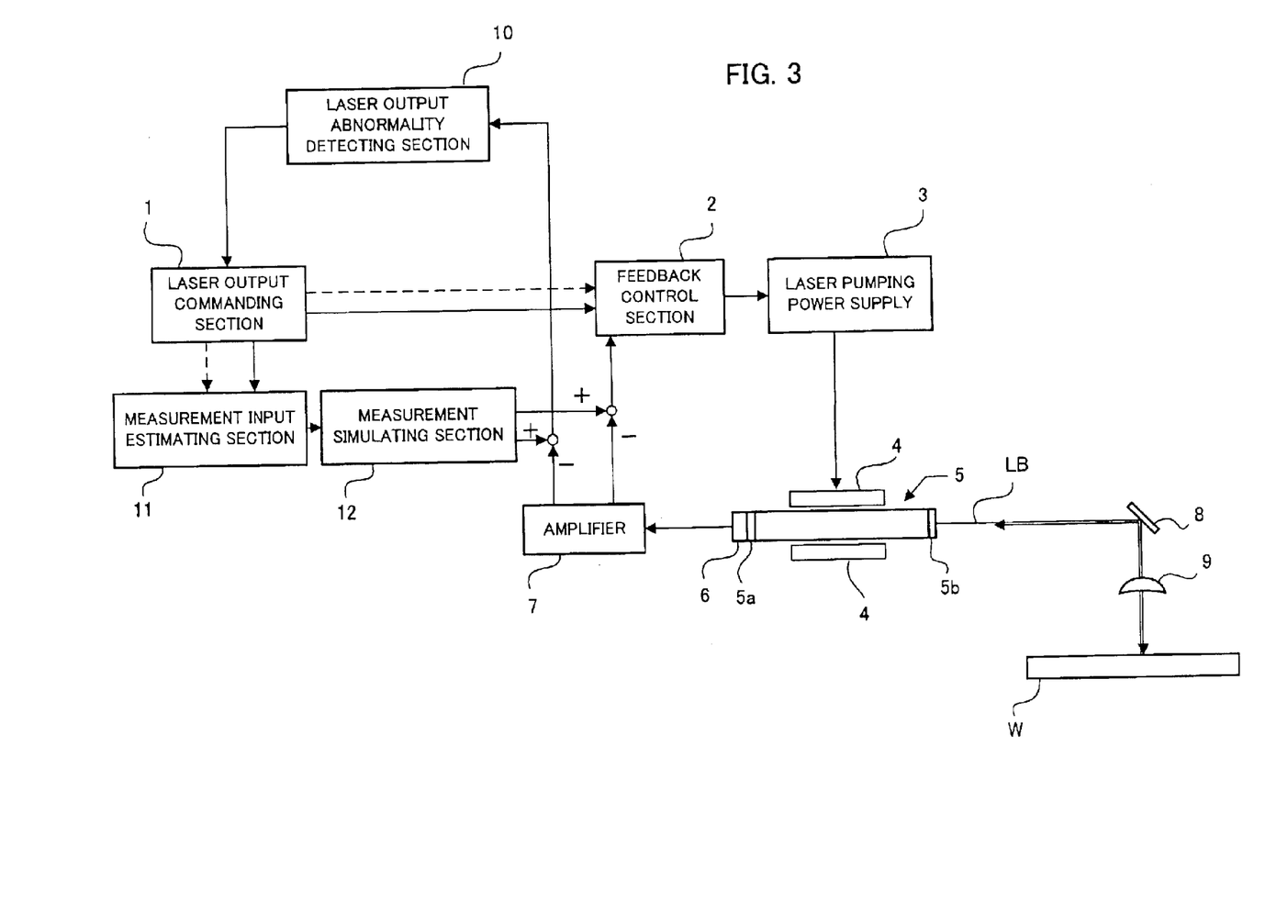
FIG. 3 is a block diagram schematically showing a system configuration of a laser machining apparatus according to a first embodiment of the present invention.

FIG. 3 schematically shows a system configuration of a laser machining apparatus according to an embodiment of the present invention. As shown in FIG. 3, a laser oscillator 5 such as a YAG laser is pumped by a pumping source 4 such as a pumping lamp and a pumping LED and emits a laser beam to a workpiece W through a mirror 8 and a condenser lens 9.

A laser output signal for controlling a laser output is issued from a laser output commanding section 1 and given to a laser pumping power supply 3 through a feedback compensation by a feedback control section 2, so that an electric power supplied to a pumping source 4 of a laser oscillator 5 is controlled in accordance with the compensated laser output signal. The laser output command is designated by a machining program or a manual operation on a control panel (not shown). In this embodiment, the laser oscillator 5 comprises a single resonator and a laser power sensor 6 is provided outside of the rear mirror 5a of the laser oscillator 5 so as to repeatedly monitor and measure the laser output power. An output signal of the laser power sensor 6 is amplified by an amplifier 7 and compared with an output signal from a measurement simulating section 12 and a resultant difference is inputted to the feedback control section 2 and also to a laser output abnormality detecting section 10. The measurement simulating section 12 simulates the measurement by the laser power sensor 6 and successively outputs a simulated value (after amplification by the amplifier 7) of the output of the laser power sensor 6. A measurement input estimating section 11 is provided at an input side of the measurement simulating section 12. The measurement input estimating section 11 receives data of the laser output command from the laser output commanding section 1. In a case of a pulse oscillation output, command values of a pulse peak, a pulse duty and a pulse frequency are sent to the measurement input estimating section 11, as indicated by the broken line. In a case of a continuous oscillation output, a command value of a laser output is sent to the measurement input estimating section 11, as indicated by the continuous line.

The measuring input estimating section 11 estimates a value representing an averaged laser output (an average value or a modified value of the average value of the laser output) which must be outputted from the laser oscillator 5 in a normal condition in a normal status of the laser machining based on the received data of the laser output command and sends the estimated value as a measurement input estimated value to the measurement simulating section 12.

In the case of the pulse oscillation output, data of the averaged laser output are stored in the form of a data table with parameters of a pulse waveform or a pulse peak value, a pulse duty and a pulse frequency, and the estimated value of the averaged laser output of the laser oscillator 5 as the measurement input to the laser power sensor 6 may be obtained based on the laser output command data by interpolation or extrapolation using the data table.

Figure 9A:
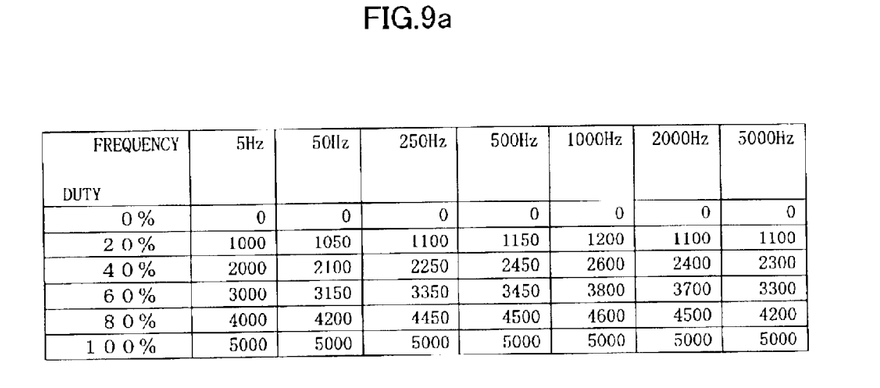
FIG. 9a is an example of a data table for estimating a measurement input in a case of machining in which scarce returned laser beam.
Figure 9B:
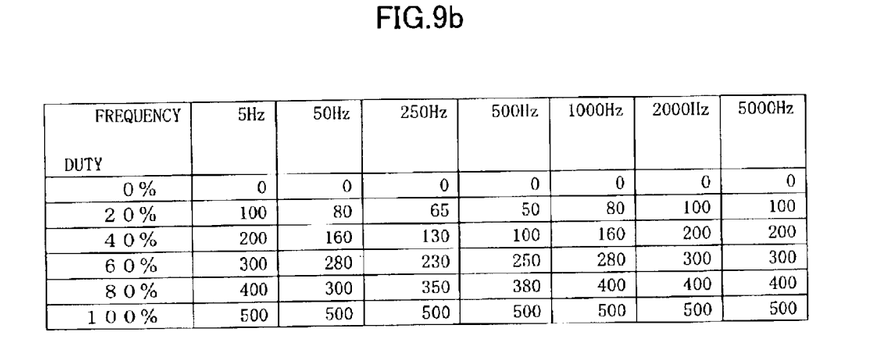
FIG. 9b is an example of a data table for estimating a measurement input in a case of a considerable amount of the returned laser beam.

Examples of the data table for use in obtaining the measurement input estimated value are shown in FIGS. 9a and 9b. A data table to be used in obtaining the measurement input estimated value may be selected in accordance with a machining condition. FIG. 9a shows an example of the data table to be used for laser cutting in which an outputted laser beam is scarcely reflected on a workpiece and returned to the laser oscillator, and FIG. 9b is an example to be used for laser marking in which a considerable part of an outputted laser beam is reflected on a workpiece and returned to the laser oscillator.

Alternative to the data table, the laser output representing value may be obtained based on the data of the laser output command using an approximation equation for estimating the averaged output power expressed by a mathematical function of the pulse wave form or the pulse peak value, the pulse duty and the pulse frequency, as the measurement input estimated value.

The measurement simulating section 12 receives the measurement input estimated value calculated by the measurement input estimating section 11 and repeatedly calculates a simulated value which is approximate to an actual measurement output from the laser power sensor 6 on the basis of characteristic data such as a time constant of the laser power sensor 6.

In this embodiment, a first-order lag system expressed by the following equation (1) or (2) is adopted as the measurement simulating section 12. The equation (1) is obtained by expressing the equation (2) as a difference equation and is advantageous in simplification of computation by a computer.

$$Ps(t)=Ps(t-\Delta t)+(PT(Pp, Fr, Du)-Ps(t-\Delta t))\cdot \Delta t/Tc \quad (1)$$

$$Ps(t)=(Ps(0)-PT(Pp, Fr, Du))\cdot \exp(-t/Tc)+PT(Pp, Fr, Du) \quad (2)$$

where t: present time $\Delta t$: computation period

Ps(t): a simulated value of the measurement output at time t

PT (Pp, Fr, Du): a measurement input estimated value based on the laser output command data (pulse peak value Pp, pulse frequency Fr, pulse duty Du)

Tc: time constant

Ps(0): a simulated value of the measurement output at the time of rise or change of the output command, for which the measured value may be substituted at the time of change of the output command.

The simulated value repeatedly obtained by the measurement simulating section 12 is compared with the amplified value of the output of the laser power sensor 6 and a signal representing a resultant difference is inputted to the feedback control section 2.

As a result of the comparison, if the measured value of the laser power (after amplification by the amplifier 7) is equal to the simulated value, the difference is zero as a matter of course. If the measured value of the laser power is lower than the simulated value, a positive difference is inputted into the feedback control section 2 and if the measured value is greater than the simulated value, a negative difference is inputted into the feedback control section 2. The feedback control section compensates the laser output command from the laser output commanding section 1 in accordance with the difference to control the laser pumping power supply 3. Thus, the laser output of the laser oscillator 5 is feedback controlled so as to follow the laser output command from the laser output commanding section 1.

On the other hand, the difference signal between the simulation value and the measured value is compared with predetermined (positive and negative) reference values for a diagnose of abnormality. If the measured value is lower than the simulation value, a positive difference is inputted into the output abnormality detecting section 10, and if the measured value is greater than the simulation value, a negative difference is inputted into the output abnormality detecting section 10. The output abnormality detecting section 10 determines whether or not the difference signal is within an allowable range and if the difference signal deviates from the allowable range, it is determined that the laser output is abnormal and a stop signal is issued to the laser output commanding section 1 to stop the operation of the laser oscillator 5.

It is determined that the laser output is abnormal in a case where the laser beam reflected on the workpiece W and returned into the laser oscillator 5 greatly increases by abnormality of the laser machining and in a case where the laser output is abnormally lowered by a malfunction of the laser oscillator, etc.

In order to explain the operation of the laser machining apparatus of this embodiment in detail, a concrete case where the laser output command 101 as shown in FIG. 2a is issued from the laser output commanding section 1 in the system as shown in FIG. 3 will be described referring to FIGS. 5a and 5b. As described, the laser output command 101 is shown with the axis of abscissa representing time (sec) and the axis of ordinate representing power (W) in FIG. 2a. As shown in FIG. 2a, the laser output command 101 designated by a machining program has a command value of 4 kW for an earlier period (3.5 sec) and a command value of 1 kW for a later period (4 sec).

Figure 5A:
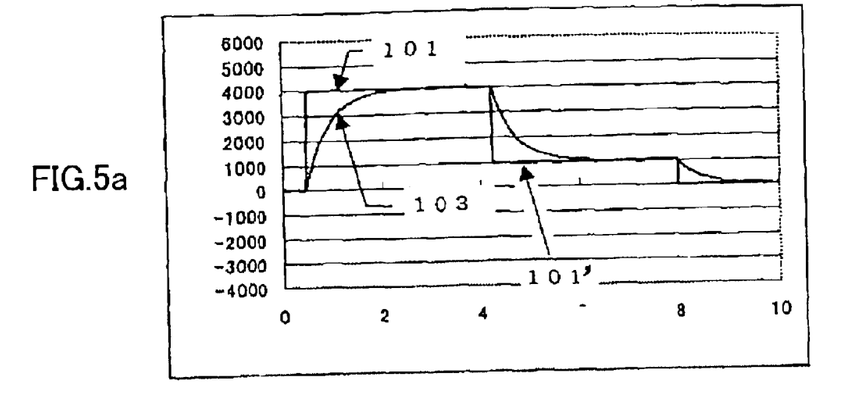
FIG. 5a is a graph showing transition of a measurement simulated value of the laser output in response to the laser output command in the system configuration as shown in FIG. 3.

FIG. 5a shows transition of a measurement simulated value 103 calculated by the measurement simulating section 12 in response to the laser output command 101. In FIGS. 5a and 5b, an axis of abscissa representing time (sec) and an axis of ordinate representing power (W) as in FIGS. 2a and 2b.

As shown in FIG. 5a, the simulated value 103 gradually rises after a rise of the laser output command 101 and approaches to reach the laser output command 101 in accordance with the response delay of the laser power sensor 6. When the laser output command 101 falls from the command value of 4 kw to the command value of 1 kW, the simulated value 103 gradually decreases and approaches to reach the command value of 1 kW, as indicated by a reference numeral 101'.

Figure 5B:
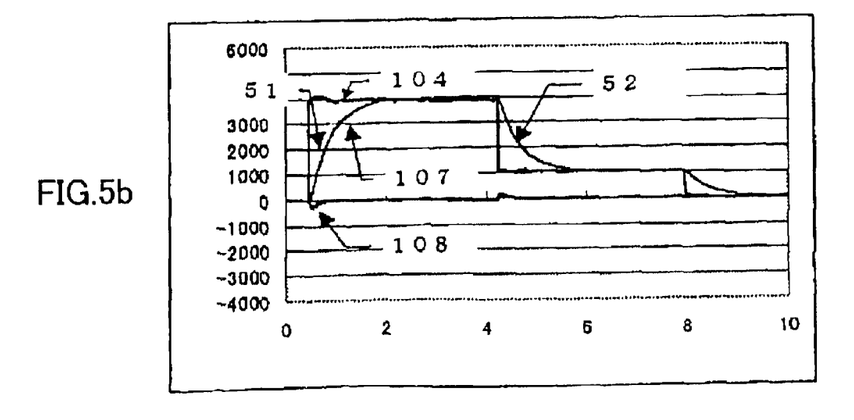
FIG. 5b is a graph showing transition of a compensated laser output command with transitions of the measured value of the laser output and a difference between the measurement simulated value and the measured value.

FIG. 5b shows transition of a compensated laser output command 104 with transitions of a measured value 107 of the laser output and a difference 108 between the measurement simulated value 103 and the measured value 107.

The transition of the simulated value 103 as shown in FIG. 5a is approximation of the measured value 107 in accordance with precision of the measurement simulation, so that the transitions of the simulated value 103 and the measured value 107 are approximately the same insofar as the laser machining and the laser power sensor 6 are in normal condition.

If the actual laser output is greater than the estimated laser output at the rise of the laser output command, the rise of the measured value 107 is quicker than the rise of the simulated value 103, and if the actual laser output is smaller than the estimated laser output, the rise of the measured value 107 is delayed from the rise of the simulated value 103, but the difference 108 between the simulated value 103 and the measured 107 is relatively small to avoid an overshoot of the laser output due to the feedback control in a period immediately after the issuance of the output command. Thus, influence of the response delay of the power sensor 6 on the feedback control is removed to make the feedback control and the laser output abnormality detection actually effective immediately after the issuance of the laser output command. Also, immediately after the fall of the laser output command, an undershoot of the laser output by the feedback control is prevented.

In this embodiment, since the relatively simple equation (1) or (2) is adopted as the measurement simulation section 12, a certain difference 108 appears immediately after the rise of the laser output command, as shown in FIG. 5b. By withholding the feedback control in a period immediately after the issuance of the laser output command, the overshoot of the laser output is made smaller.

Further, it is possible to make the feedback control and the abnormality detection more precise in a period immediately after the rise and fall of the laser output command by more precise measurement simulation using more accurate approximation equation or data table.

As described, significant overshoot and undershoot of the laser output due to the feedback control are prevented in the periods 51 and 52 of the rise and fall of the laser output command, respectively. Further, the laser output abnormality detection using the difference 108 between the simulated value 103 and the measured value 107 is effectively performed from a period immediately after the issuance of the laser output command.

Figure 4:
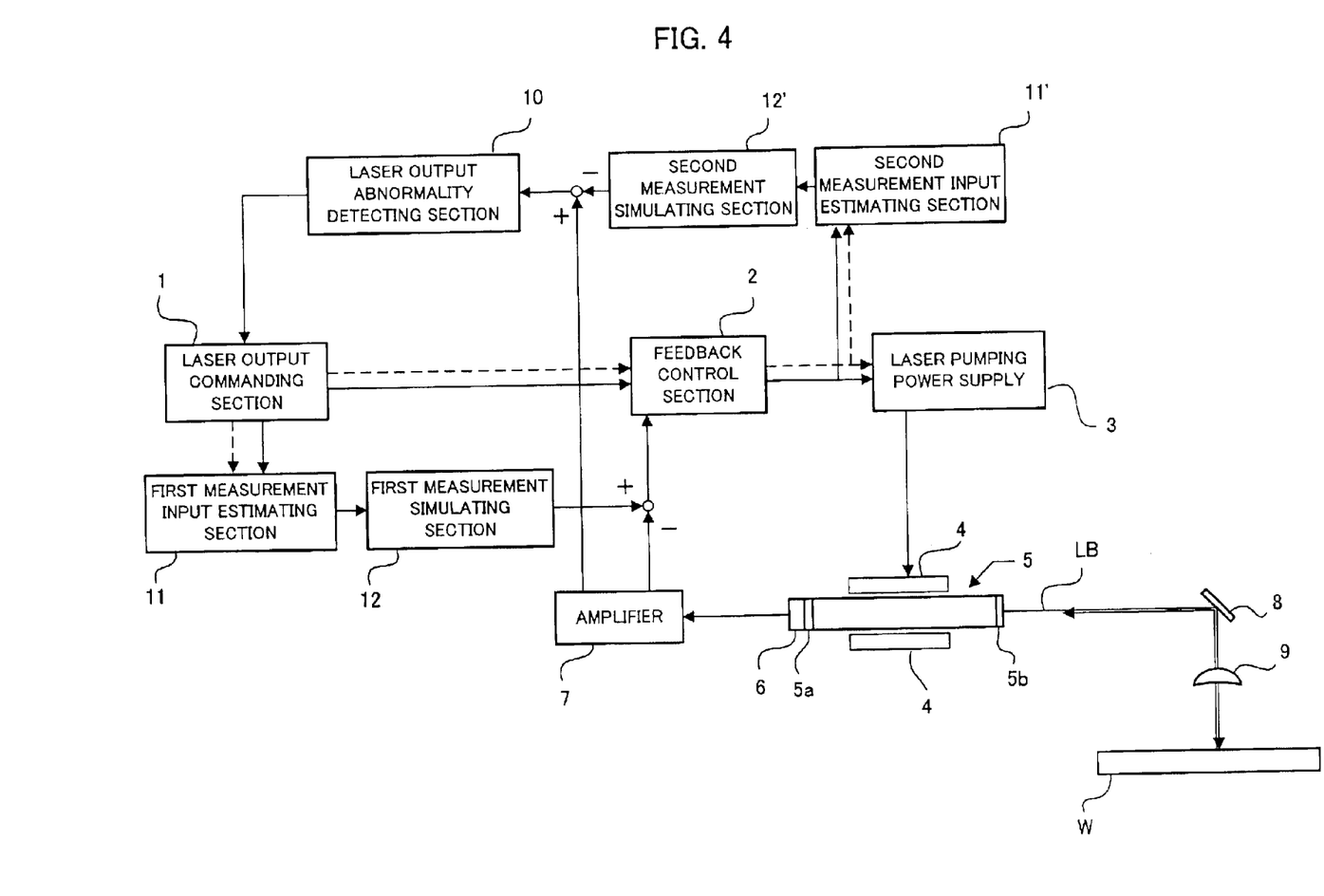
FIG. 4 is a block diagram schematically showing a system configuration of a laser machining apparatus according to a second embodiment of the present invention.

FIG. 4 schematically shows a system configuration of a laser machining apparatus according to a second embodiment of the present invention. The following description on the second embodiment will be made with respect to a difference of the laser machining apparatus of this embodiment from that of the first embodiment.

In this embodiment, there are provided a second measurement input estimating section 11' and a second measurement simulating section 12' for estimating an measurement input value and an measurement output value of the laser power sensor 6 based on the compensated laser output command subjected to the feedback control by the feedback control section 2, separately from the laser measurement input estimating section 11 and the measurement simulating section 12 for estimating the measurement input and output values, respectively, of the laser power sensor 6 based on the laser output command issued from the laser commanding section 1. In the following description, the measurement input estimating section 11 is referred to as a first measurement input estimating section, and the measurement simulating section 12 is referred to as a first measurement simulating section.

An example of operation of the system of the laser machining apparatus as shown in FIG. 4 in a case where the laser beam reflected on the workpiece W and returned to the laser oscillator 5 greatly increases in the laser machining will be described referring to graphs of FIGS. 6a–6c. When an abnormality of the laser machining such as laser cutting and laser welding occurs, absorption of the outputted laser beam by the workpiece W is lowered and a considerable part of the outputted laser beam returns to the laser oscillator 5. Such state is undesirable since the laser beam may be irradiated on an unexpected portion of the laser machining apparatus.

Figure 6A:
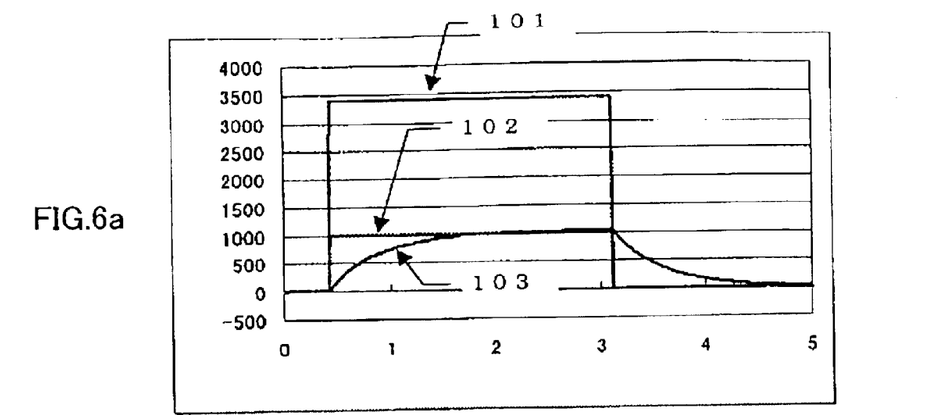
FIG. 6a is a graph showing transitions of an estimated value of the measurement input and a measurement simulated value in response to the laser output command for pulse oscillation.

In the example of FIG. 6a, the laser output is commanded in the form of a pulse having a peak value of 3400 W, a pulse frequency of 250 Hz, and a pulse duty of 20%. Only the pulse peak value 101 in these command factors is shown in FIG. 6a. In the pulse oscillation laser output, it is usual that an actual peak output is greater than the pulse peak command and sometimes reaches to a value several times greater than the command value.

The pulse oscillation laser output having the peak value greater than the command value is preferable since such laser output has a high machining efficiency relatively to an averaged laser output. However, the averaged laser output is made greater than a product of the command values of the pulse peak and the pulse duty. In this example, a laser power of 1000W is outputted not a value 680W which is 20% of the pulse peak command value of 3400W.

The first laser measurement input estimating section 11 calculates a first measurement input estimated value 102 which is a value representing the estimated averaged laser output based on the data of the laser output command from the laser output commanding section 1 using the table storing relation of an expected average laser output with commanded values of the pulse peak, the pulse frequency and the pulse duty, as shown in FIG. 9a, or the approximation equation relevant to the table. The data not described in the table are obtained by interpolation or extrapolation using the adjacent data in the table.

The first measurement simulating section 12 receives the measurement input estimated value 102 and calculates a first simulated value 103 of the measurement output which approaches the measurement input estimated value 102 by simulating the measurement by the power sensor 6 having the response delay.

The feedback control section 2 compensates the laser output command from the laser output commanding section 1 using a difference 108 between the measured value 107 and the first simulated value 103. Immediately after an issuance of the laser output command, since there is a scarce difference between the measured value 107 and the first simulated value 103, a compensation amount is nearly zero and the compensated laser output command approximately equal to the laser output command from the laser output commanding section 1 is outputted to the pumping power supply 3. When the laser oscillator 5 starts oscillation of laser beam, the laser beam of an expected power is outputted from the laser oscillator 5 after 0.0002 sec. The laser power sensor 6 as means for measuring the laser output receives a part of the laser beam and performs measurement of the output power of the laser beam on the basis of magnitude of heat flow by measuring a difference of temperatures at two points in diffusion of heat produced by the inputted part of the laser beam. The measured value 107 slowly approaches the actual laser output value until the heat flow caused by the inputted part of the laser beam is in steady status.

After the issuance of the laser output command, the difference 108 between the simulated value 103 and the measured value 107 is multiplied by a predetermined gain and the resultant product is added to the laser output command from the laser output commanding section 1 to be compensated by the feedback control section 2.

Figure 6B:
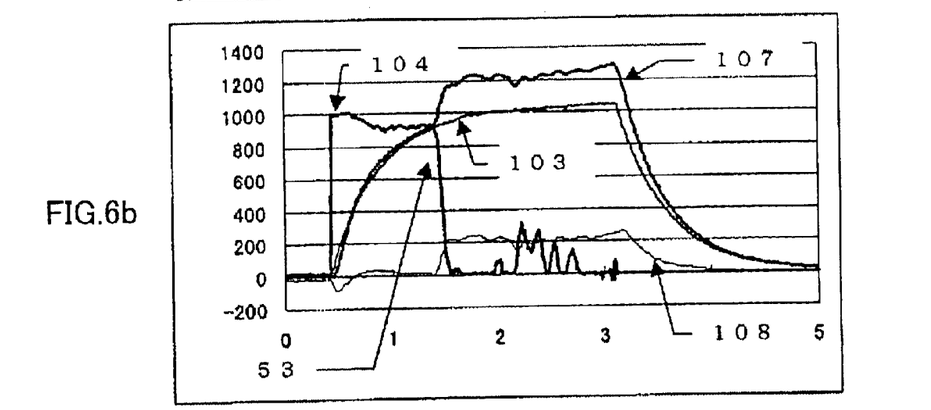
FIG. 6b is a graph showing transitions of the measured value of the laser output, a first simulated value of measurement, a compensated laser output command and a difference between the first simulated value and the measured value in a case where a returned laser beam increases in the laser machining.
Figure 6C:
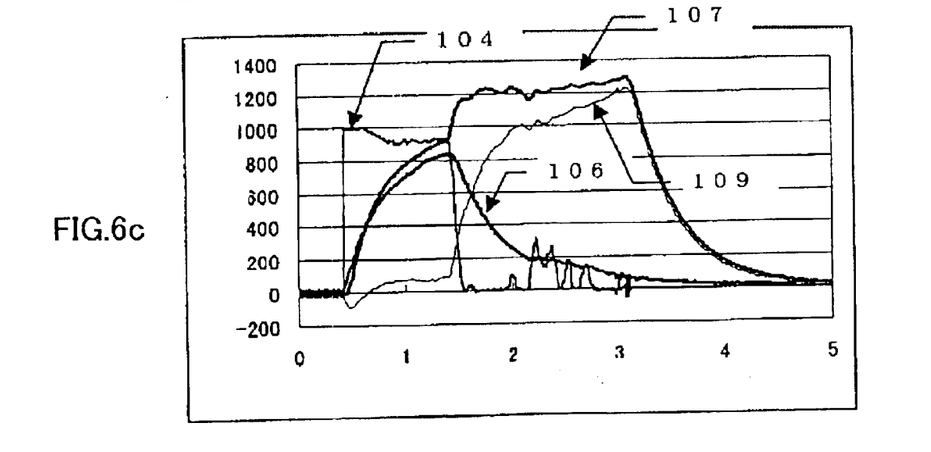
FIG. 6c is a graph showing transitions of the measured value of the laser output, the compensated laser output command, a second simulated value of measurement based on the compensated laser output command, and a difference between the second simulated value and the measured value in the same case.

If the laser beam reflected on the workpiece W and returned to the laser oscillator 5 increases due to an abnormality in the laser machining, the feedback control and the laser output abnormality detection are performed as follows;

As shown in FIG. 6b, when the returned laser beam increases by an abnormality in the laser machining at a point of time indicated by the reference numeral 53, the measured value 107 increases in comparison with the simulated value 103 because of the returned laser beam to the laser oscillator 5, to increase the difference 108 between the simulated value 103 and the measured value 107. The feedback control section 2 compensates the laser output command from the laser output commanding section 1 using the difference 108 as a feedback error to reduce the compensated laser output command 104 so that the measured value 107 approaches the simulation value 103. The difference 108 as the feedback error is maintained not to be excessively large.

On the other hand, the second measurement input estimating section 11' and the second measurement simulating section 12' estimate the measured value of the laser output based on data of pulse peak value, pulse frequency and pulse duty of the laser output command 104 after subjected to the feedback compensation and outputs a second simulated value 106. As shown in FIG. 6c, the second simulated value 106 is a simulated value of the output of the power sensor 6 in accordance with the laser output command 104 reduced by the feedback compensation. In other words, the second simulation value 106 approximately indicates a part of the measured value 107 excluding the returned laser beam.

Therefore, the difference 109 between the measured value 107 and the second simulated value 106 represents the returned laser beam by the abnormal reflection. Thus, the abnormal laser output detecting section 10 securely and precisely detects an abnormality of the laser machining based on determination whether or not the difference 109 is within the allowable range, and takes a countermeasure of stopping the laser output or increasing the laser output command if an abnormality is detected to overcome the abnormal state of the laser machining.

Figure 7:
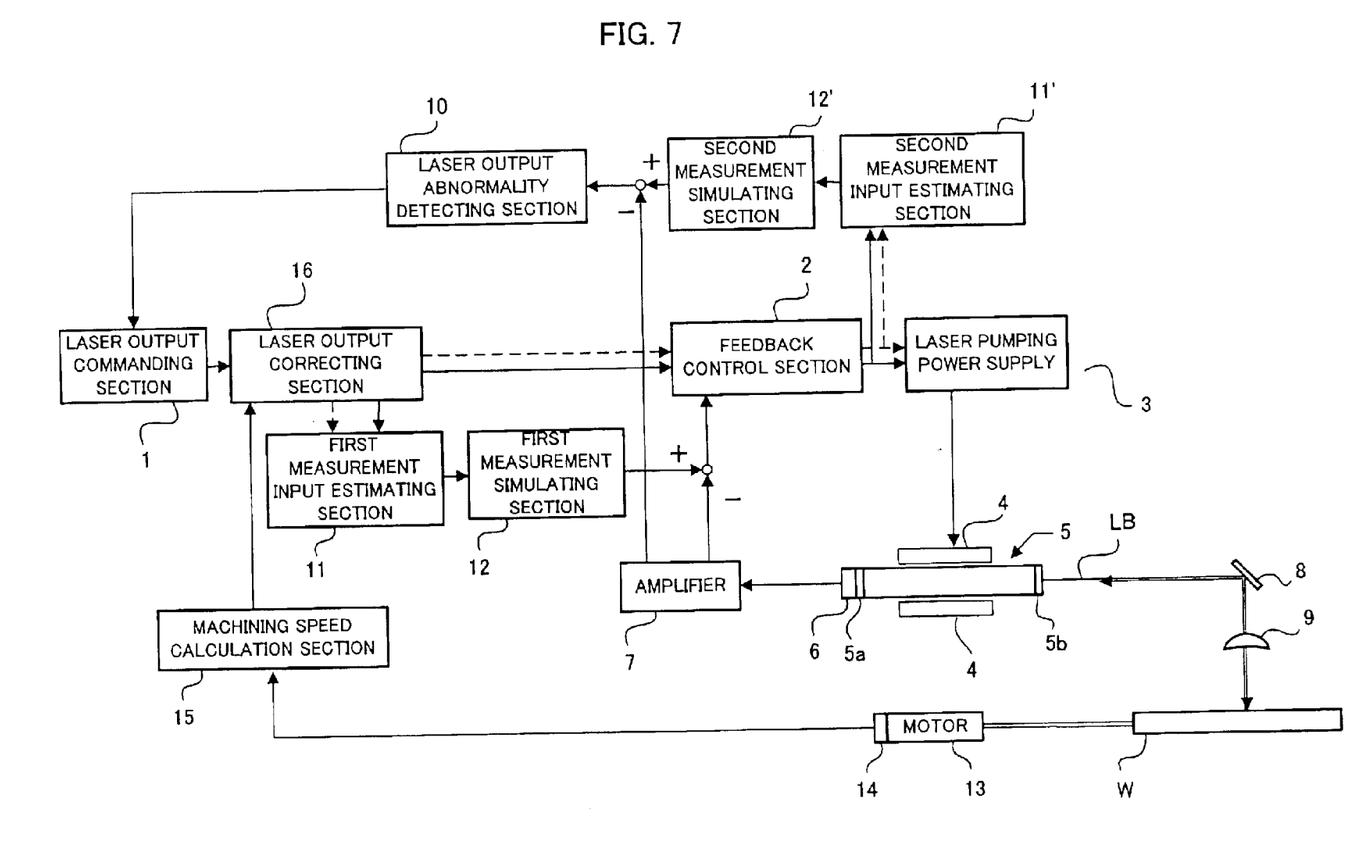
FIG. 7 is a block diagram schematically showing a system configuration of a laser machining apparatus according to a third embodiment of the present invention.

FIG. 7 schematically shows a system configuration of a laser machining apparatus according to a third embodiment of the present invention.

In this embodiment, the system of the laser machining apparatus is constituted taking account of a case where laser machining at a constant machining speed is not appropriate for a specific machining path in machining various shapes. For example, in laser cutting along a machining path including a corner portion of a right angle, it is necessary to reduce the machining speed at an apex of the corner portion so as to maintain precision of the machined shape. In such laser machining, since the machining speed is reduced at the corner portion, there is a case where an input amount of heat generated by the laser beam per a unit length of the machining path increases, to make the laser machining unstable.

In view of the above, according to this embodiment, an appropriate machining speed is calculated by a machining speed calculating section 15 utilizing an output of a pulse generator 14 as an encoder of a driving motor 13 for driving a work table on which a workpiece W is mounted. A laser output command correcting section 16 corrects the laser output command from the laser output commanding section 1 in accordance with the appropriate machining speed calculated by the machining speed calculating section 15. The correction of the laser output command in accordance with the machining speed is utilized in feedback control of the laser output using the measurement input estimation by the first measurement input estimating section 11 and the measurement simulation by the first measurement simulating section 12, and also the laser output abnormality detection using the measurement input estimation by the second measurement input estimating section 11' and the measurement simulation by the second measurement simulating section 12'.

Thus, the feedback control and abnormality detection of the laser output are performed at high precision based on the laser output command automatically corrected in accordance with the machining speed. Conventionally, it has been difficult to detect an abnormality of the laser machining using a power sensor having a long response time in a case where the laser output command varies dynamically such as the automatic correction of the laser output in accordance with the machining speed. Such detection is enabled according to the present invention. The correction of the laser output command may be performed by an override manually designated by an operator or an external signal from an external device.

There is known a laser machining which is called as laser marking for drawing patterns or characters on a workpiece by slightly graving the workpiece by an attenuated laser beam. In the laser marking, since there exists a considerable returned laser beam in normal machining condition, the estimation of the laser output has to be performed taking account of the returned laser beam in the laser measurement input estimation. This requirement can be met by changing the method of calculating the estimated value of the laser output and the data for the calculation in accordance with the laser cutting or the laser marking to be performed. Similarly, it is desirable to take the returned laser beam in the normal condition into account in performing laser piercing and laser welding. An abnormality in the laser machining such as laser marking and the laser welding can be detected based on the difference between the measured value and the estimated value of the laser output, which increases when an abnormality occurs. FIG. 9a shows the example of the data table for estimation of the measurement input of the laser output for the case in which the considerable returned laser beam exists in the normal machining.

In the laser machining in which the considerable returned laser beam exist in the normal machining such as the laser marking and the laser piercing, dispersion of the measured value of the laser output is greater than that in the laser cutting in which the returned laser beam scarcely exists in the normal machining. In a case where the laser cutting is started immediately after completion of the laser marking or the laser cutting, the difference between the simulated value and the measured value may greatly increase. Each time when the machining condition is changed, the detection of the laser output abnormality may be reset by substituting the measured value for the simulation value to carry out the precise laser output abnormality detection from the time of the resetting.

Figure 8:
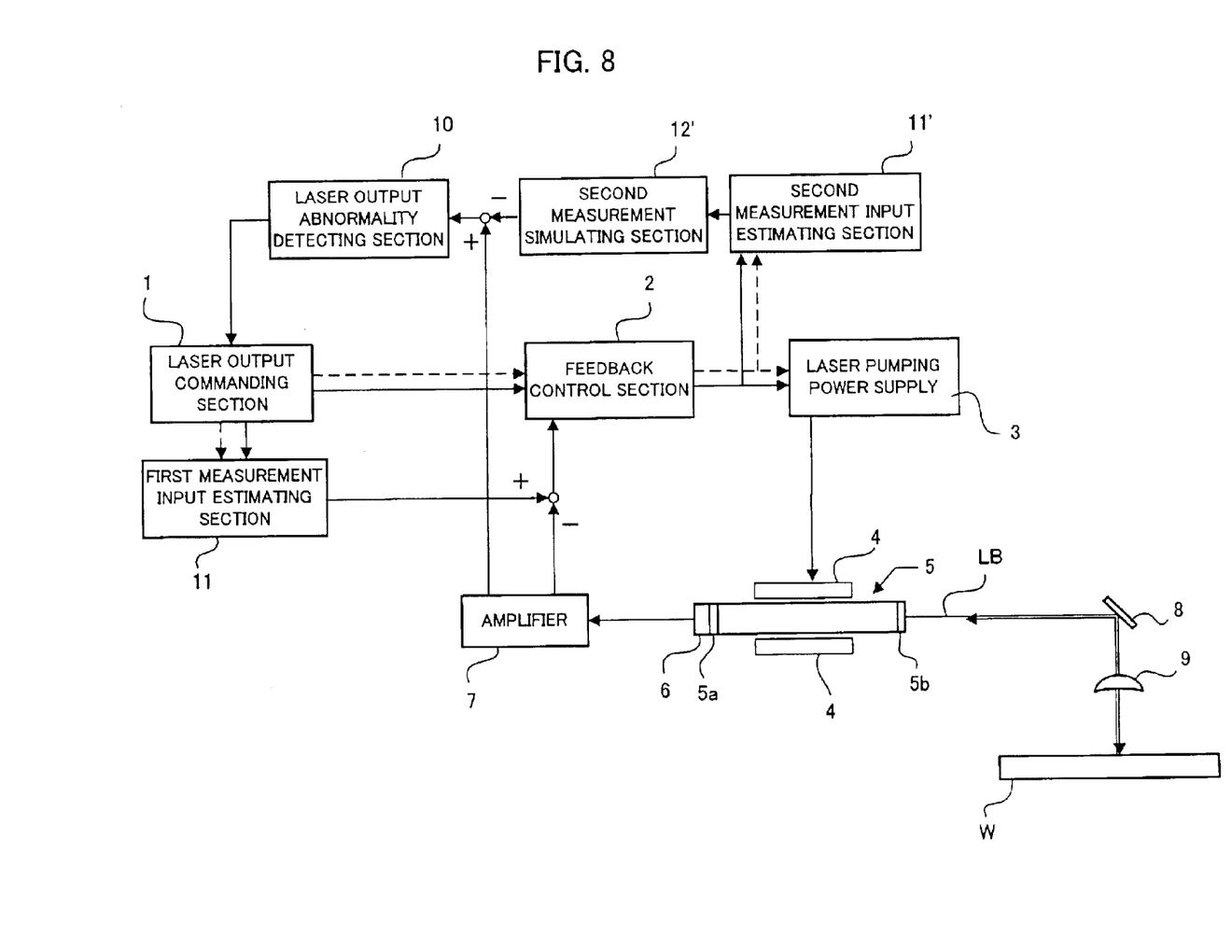
FIG. 8 is a block diagram schematically showing a system configuration of a laser machining apparatus according to a fourth embodiment of the present invention.

FIG. 8 schematically shows a system configuration of a laser machining apparatus according to a fourth embodiment of the present invention. The system configuration of this embodiment is obtained by omitting the first measurement simulating section 12 in the second embodiment as shown in FIG. 4. Thus, a signal indicating the difference between the value representing the averaged laser output (measurement input estimated value) calculated by the first measurement input estimating section 11 and the measured value of the laser output is used in the feedback control of the laser output by the feedback control section 2.

The second measurement input estimating section 11' calculates the measurement input estimated value based on the data of the pulse waveform or pulse peak value, the pulse duty and the pulse frequency of the compensated laser output command after subjected to the feedback compensation using the data table or the equivalent approximation equation, and transfers the measurement input estimated value to the second measurement simulating section 12'. The second measurement simulating section 12' calculates the second simulated value 106 of the laser output measurement based on the received measurement input estimated value in the same manner as in the second embodiment.

The laser output abnormality detecting section 10 compares a difference between the second simulated value 106 and the measured value 107 of the laser output with predetermined reference values (positive or negative values) to carry out the laser output abnormality detection. If the measured value 107 is lower than the second simulated value 106, a negative difference signal is inputted into the laser output abnormality detecting section 10, and if the measured value is greater than the simulation value, a positive difference signal is inputted into the laser output abnormality detecting section 10. The laser output abnormality detecting section 10 determines whether or not the difference signal is within the allowable range and if the difference signal deviates from the allowable range, the laser output abnormality detecting section 10 determines that an abnormality occurs and issues a stop signal to the laser output commanding section 1 to stop the operation of the laser oscillator 5. In this embodiment, although precision of the feedback control is relatively lowered, the laser output abnormality detection is carried out with sufficient precision.

In the above system configuration, the first measurement input estimating section 11 may further omitted, so that a signal indicating a difference between the laser output command issued from the laser output commanding section 1 and the measured value of the laser output by the laser power sensor 6 may be used for the feedback control of the laser output by the feedback control section 2.

As described, according to the present invention, the feedback control of the laser output can be carried out from an early stage immediately after issuance of the laser output command utilizing the measured value of the laser output by a laser power sensor having a relatively long response time. Further, since the overshoot or undershoot of the laser output due to the feedback control is eliminated, an abnormality of the laser output can be detected precisely without influenced by the overshoot or under shoot of the laser output. Further, the feedback control and the abnormality detection can be performed irrespective of the laser machining condition by using the estimation of the laser measurement input. Thus, the present invention contributes stabilization of the laser machining.

What is claimed is:

1. A laser machining apparatus for machining a workpiece by a laser beam outputted from a laser oscillator in accordance with a laser output command, said laser machining apparatus comprising:

laser output commanding means for issuing the laser output command;

laser power measuring means for measuring an output power of the laser beam and outputting a measured value of the output power including an error due to a response characteristic thereof;

measurement simulating means for estimating the measured value outputted from said laser power measuring means based on the laser output command issued from said laser output commanding means and the response characteristic of said laser power measuring means, and outputting a simulated value of the laser power measurement; and feedback control means for feedback compensating the laser output command in accordance with a difference between the measured value outputted from said laser power measuring means and the simulated value outputted from said measurement simulating means.

2. A laser machining apparatus according to claim 1, further comprising laser output abnormality detecting means for detecting an abnormality of the laser output based on a difference between the simulated value outputted from said measurement simulating means and the measured value outputted from said laser power measuring means.

3. A laser machining apparatus according to claim 1, further comprising laser output command correcting means for correcting the laser output command issued from said laser output commanding means in accordance with operation data of the laser machining apparatus and/or an external signal.

4. A laser machining apparatus according to claim 1, wherein said measurement simulating means comprises measurement input estimating means for estimating a laser power representative value representing an averaged laser power inputted into said laser power measuring means based on the laser output command issued from said laser output commanding means, and estimates the measured value outputted from said laser power measuring means using the laser power representative value estimated by said measurement input estimating means.

5. A laser machining apparatus according to claim 4, wherein said measurement input estimating means stores a data table containing data of the averaged laser power with parameters of a pulse waveform or a pulse peak value, a pulse duty and a pulse frequency, and obtains the laser power representative value using the data in said data table by interpolation or extrapolation.

6. A laser machining apparatus according to claim 5, wherein said measurement input estimating means stores a plurality of data tables for the measurement input estimation and selectively uses one of the data tables in accordance with a machining condition.

7. A laser machining apparatus according to claim 4, wherein said measurement input estimating means stores an approximation equation for expressing the averaged laser power by a mathematical function of a pulse waveform or a pulse peak value, a pulse duty and a pulse frequency, and obtains the laser power representative value using the approximation equation.

8. A laser machining apparatus according to claim 7, wherein said measurement input estimating means stores a plurality of approximation equations for the measurement input estimation and selectively uses one of the approximation equations in accordance with a machining condition.

9. A laser machining apparatus according to claim 1, wherein the measured value outputted from said laser power measuring means is substituted for an initial value of the simulated value by said measurement simulating means each time when said laser output commanding means changes the laser output command in accordance with a change of the machining condition.

10. A laser machining apparatus for machining a workpiece by a laser beam outputted from a laser oscillator in accordance with a laser output command, said laser machining apparatus comprising:

laser output commanding means for issuing the laser output command;

laser power measuring means for measuring an output power of the laser beam and outputting a measured value including an error due to a response characteristic thereof;

feedback control means for feedback compensating the laser output command issued from said laser output commanding means in accordance with a difference between the measured value outputted from said laser power measuring means and the laser output command; and measurement simulating means for estimating the measured value outputted from said laser power measuring means based on the compensated laser output command by said feedback control means and the response characteristic of said laser power measuring means, and outputting a simulated value of the laser power measurement; and laser output abnormality detecting means for detecting an abnormality of the laser output based on a difference between the simulated value outputted from said measurement simulating means and the measured value outputted from said laser power measuring means.

11. A laser machining apparatus according to claim 10, further comprising laser output command correcting means for correcting the laser output command issued from said laser output commanding means in accordance with operation data of the laser machining apparatus and/or an external signal.

12. A laser machining apparatus according to claim 10, wherein said measurement simulating means comprises measurement input estimating means for estimating a laser power representative value representing an averaged laser power inputted into said laser power measuring means based on the compensated laser output command by said feedback control means, and estimates the measured value outputted from said laser power measuring means using the laser power representative value estimated by said measurement input estimating means.

13. A laser machining apparatus according to claim 12, wherein said measurement input estimating means stores a data table containing data of the averaged laser power with parameters of a pulse waveform or a pulse peak value, a pulse duty and a pulse frequency, and obtains the laser power representative value using the data in said data table by interpolation or extrapolation.

14. A laser machining apparatus according to claim 13, wherein said measurement input estimating means stores a plurality of data tables for the measurement input estimation and selectively uses one of the data tables in accordance with a machining condition.

15. A laser machining apparatus according to claim 12, wherein said measurement input estimating means stores an approximation equation for expressing the averaged laser power by a mathematical function of a pulse waveform or a pulse peak value, a pulse duty and a pulse frequency, and obtains the laser power representative value using the approximation equation.

16. A laser machining apparatus according to claim 15, wherein said measurement input estimating means stores a plurality of approximation equations for the measurement input estimation and selectively uses one of the approximation equations in accordance with a machining condition.

17. A laser machining apparatus according to claim 10, wherein the measured value outputted from said laser power measuring means is substituted for an initial value of the simulated value by said measurement simulating means each time when said laser output commanding means changes the laser output command in accordance with a change of the machining condition.

18. A laser machining apparatus for machining a workpiece by a laser beam outputted from a laser oscillator in accordance with a laser output command, said laser machining apparatus comprising:

laser output commanding means for commanding the laser output;

laser power measuring means for measuring an output power of the laser beam and outputting a measured value including an error due to a response characteristic thereof;

first measurement-simulating means for estimating the measured value outputted from said laser power measuring means based on the laser output command issued from said laser output commanding means and the response characteristic of said laser power measuring means, and outputting a first simulated value of the laser power measurement;

feedback control means for feedback compensating the laser output command issued from said laser output commanding means in accordance with a difference between the measured value outputted from said laser power measuring means and the first simulated value outputted from said first-measurement simulating means;

second measurement-simulating means for estimating the measured value outputted from said laser power measuring means based on the compensated laser output by said feedback control means and the response characteristic of said laser power measuring means, and outputting a second simulated value of the laser power measurement; and laser output abnormality detecting means for detecting an abnormality of the laser output based on a difference between the second simulated value outputted from said second measurement-simulating means and the measured value outputted from said laser power measuring means.

19. A laser machining apparatus according to claim 18, further comprising laser output command correcting means for correcting the laser output command issued from said laser output commanding means in accordance with operation data of the laser machining apparatus and/or an external signal.

20. A laser machining apparatus according to claim 18, wherein said first measurement-simulating means comprises a first measurement-input estimating means for estimating a laser power representative value representing an averaged laser power inputted into said laser power measuring means based on the laser output command issued from said laser output commanding means, and estimates the measured value outputted from said laser power measuring means using the laser power representative value estimated by said first-measurement input estimating means, and said second-measurement simulating means comprises a second measurement-input estimating means for estimating a laser power representative value representing an averaged laser power inputted into said laser power measuring means based on the compensated laser output command by said feedback control means, and estimates the measured value outputted from said laser power measuring means using the laser power representative value estimated by said second measurement-input estimating means.

21. A laser machining apparatus according to claim 20, wherein at least one of said first and second measurement-input estimating means stores a data table containing data of the averaged laser power with parameters of a pulse waveform or a pulse peak value, a pulse duty and a pulse frequency, and obtains the laser power representative value using the data in said data table by interpolation or extrapolation.

22. A laser machining apparatus according to claim 21, wherein said at least one measurement-input estimating means stores a plurality of data tables for the measurement input estimation and selectively uses one of the data tables in accordance with a machining condition.

23. A laser machining apparatus according to claim 20, wherein at least one of said first and second measurement-input estimating means stores an approximation equation for expressing the averaged laser power by a mathematical function of a pulse waveform or a pulse peak value, a pulse duty and a pulse frequency, and obtains the laser power representative value using the approximation equation.

24. A laser machining apparatus according to claim 23, wherein said at least one measurement-input estimating means stores a plurality of approximation equations for the measurement input estimation and selectively uses one of the equations in accordance with a machining condition.

25. A laser machining apparatus according to claim 18, wherein the measured value outputted from said laser power measuring means is substituted for an initial value of the simulated value by said measurement simulating means each time when said laser output commanding means changes the laser output command in accordance with a change of the machining condition.

* * * * *